United States Patent
Kondo

(10) Patent No.: US 11,313,915 B2
(45) Date of Patent: Apr. 26, 2022

(54) METHODS AND SYSTEM FOR A BATTERY

(71) Applicant: SEMICONDUCTOR COMPONENTS INDUSTRIES, LLC, Phoenix, AZ (US)

(72) Inventor: Hideo Kondo, Oizumi-Machi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 196 days.

(21) Appl. No.: 16/808,562

(22) Filed: Mar. 4, 2020

(65) Prior Publication Data
US 2021/0278471 A1    Sep. 9, 2021

(51) Int. Cl.
G01R 31/3842    (2019.01)
G01R 31/367     (2019.01)
H02J 7/00       (2006.01)

(52) U.S. Cl.
CPC ....... *G01R 31/3842* (2019.01); *G01R 31/367* (2019.01); *H02J 7/0048* (2020.01); *H02J 7/0063* (2013.01)

(58) Field of Classification Search
None
See application file for complete search history.

(56) References Cited

U.S. PATENT DOCUMENTS

| | | | |
|---|---|---|---|
| 2007/0290701 A1* | 12/2007 | Nguyen | G01R 15/202 324/117 H |
| 2013/0073236 A1* | 3/2013 | Wu | H01M 10/48 702/63 |
| 2013/0320989 A1 | 12/2013 | Inoue | |
| 2017/0291500 A1 | 10/2017 | Miyaki | |
| 2018/0143253 A1* | 5/2018 | Kondo | G01R 31/367 |
| 2019/0054837 A1 | 2/2019 | Tanaka | |

* cited by examiner

*Primary Examiner* — Jas A Sanghera
(74) *Attorney, Agent, or Firm* — Dickinson Wright PLLC

(57) ABSTRACT

Various embodiments of the present technology may provide methods and system for a battery. The system may provide a fuel gauge circuit connected to a battery, a sense resistor, and a bypass circuit to direct a discharge current away from a sense resistor. The fuel gauge circuit may control operation of the bypass circuit.

17 Claims, 4 Drawing Sheets

METHODS AND SYSTEM FOR A BATTERY

BACKGROUND OF THE TECHNOLOGY

Many battery-powered systems include a fuel gauge to measure various parameters of the battery. One such parameter is the discharge current of the battery, which is typically measured using a sense resistor. This method, however, may result in power loss, especially during periods of high current.

SUMMARY OF THE INVENTION

Various embodiments of the present technology may provide methods and system for a battery. The system may provide a fuel gauge circuit connected to a battery, a sense resistor, and a bypass circuit to direct a discharge current away from a sense resistor. The fuel gauge circuit may control operation of the bypass circuit.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, logic gates, timers, memory devices, switches, semiconductor devices, such as transistors and capacitors, and the like, which may carry out a variety of functions. In addition, the present technology may be integrated in any number of electronic systems, such as automotive, aviation, "smart devices," portables, e-cigarettes, aroma therapy puff systems, vaping devices, and consumer electronics, and the systems described are merely exemplary applications for the technology.

Figure 1:
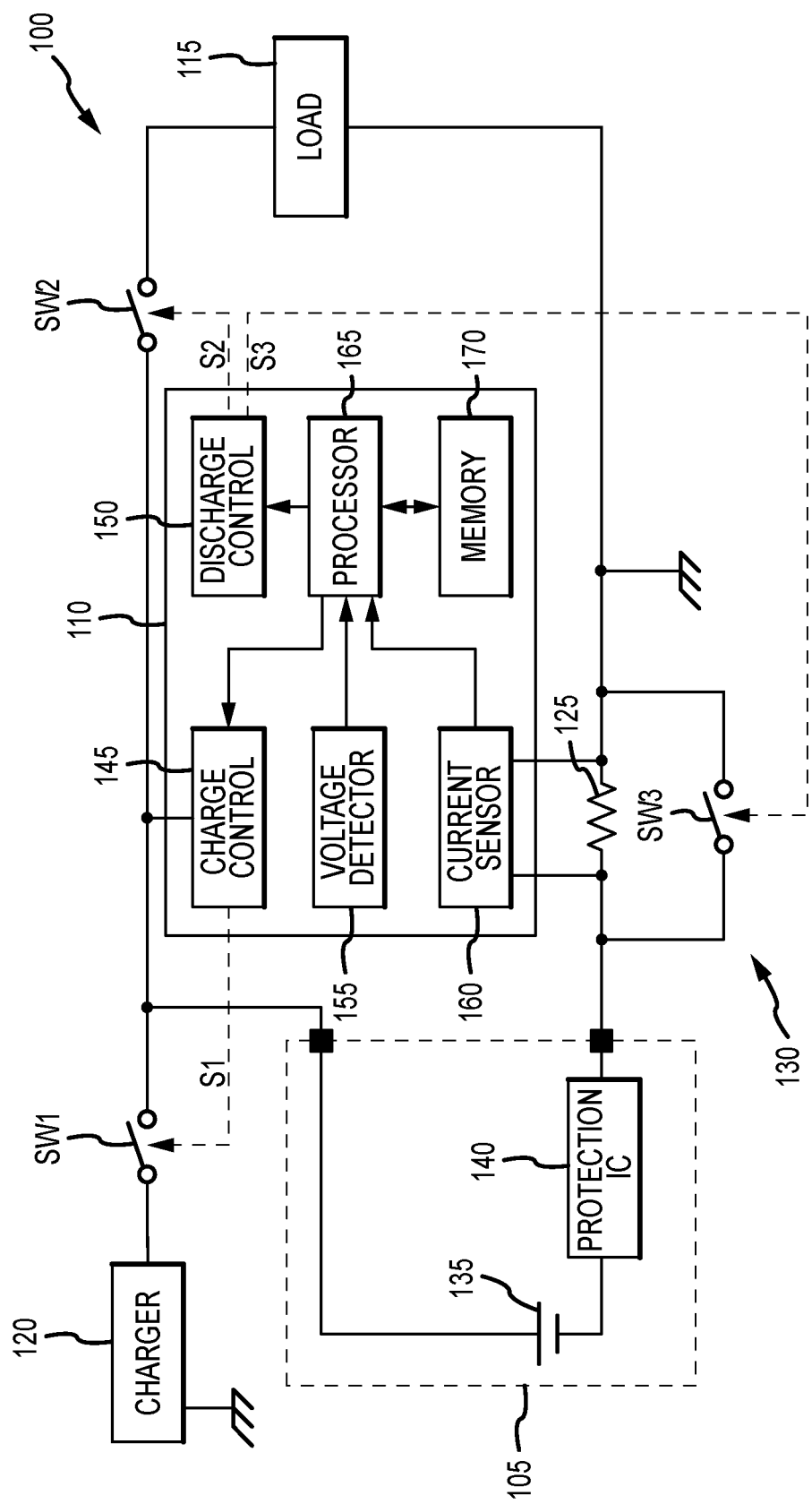
FIG. 1 is a block diagram of a battery system in accordance with an exemplary embodiment of the present technology.
Figure 2:
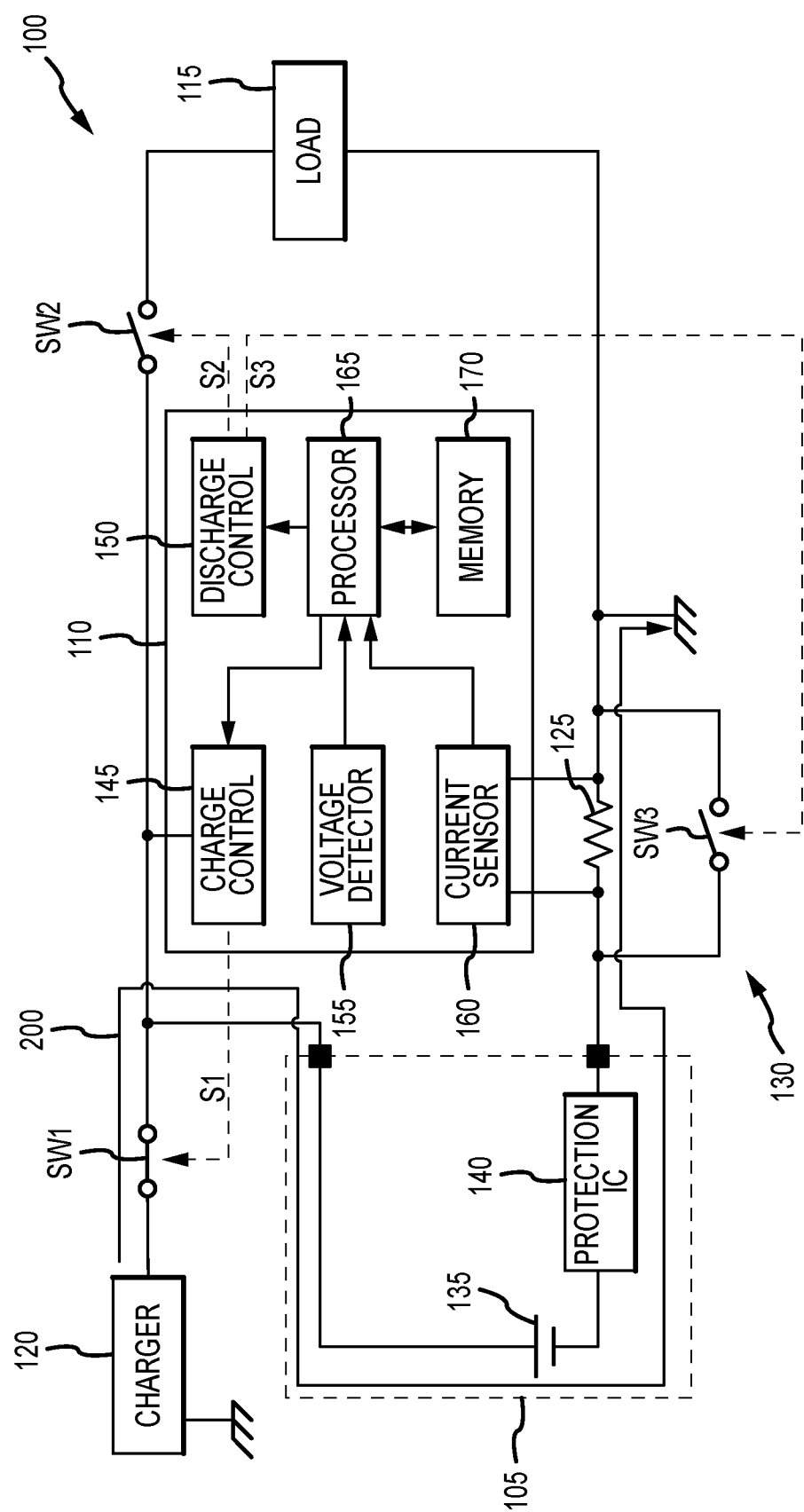
FIG. 2 is the block diagram of the battery system in a charging mode and accordance with an exemplary embodiment of the present technology.
Figure 3:
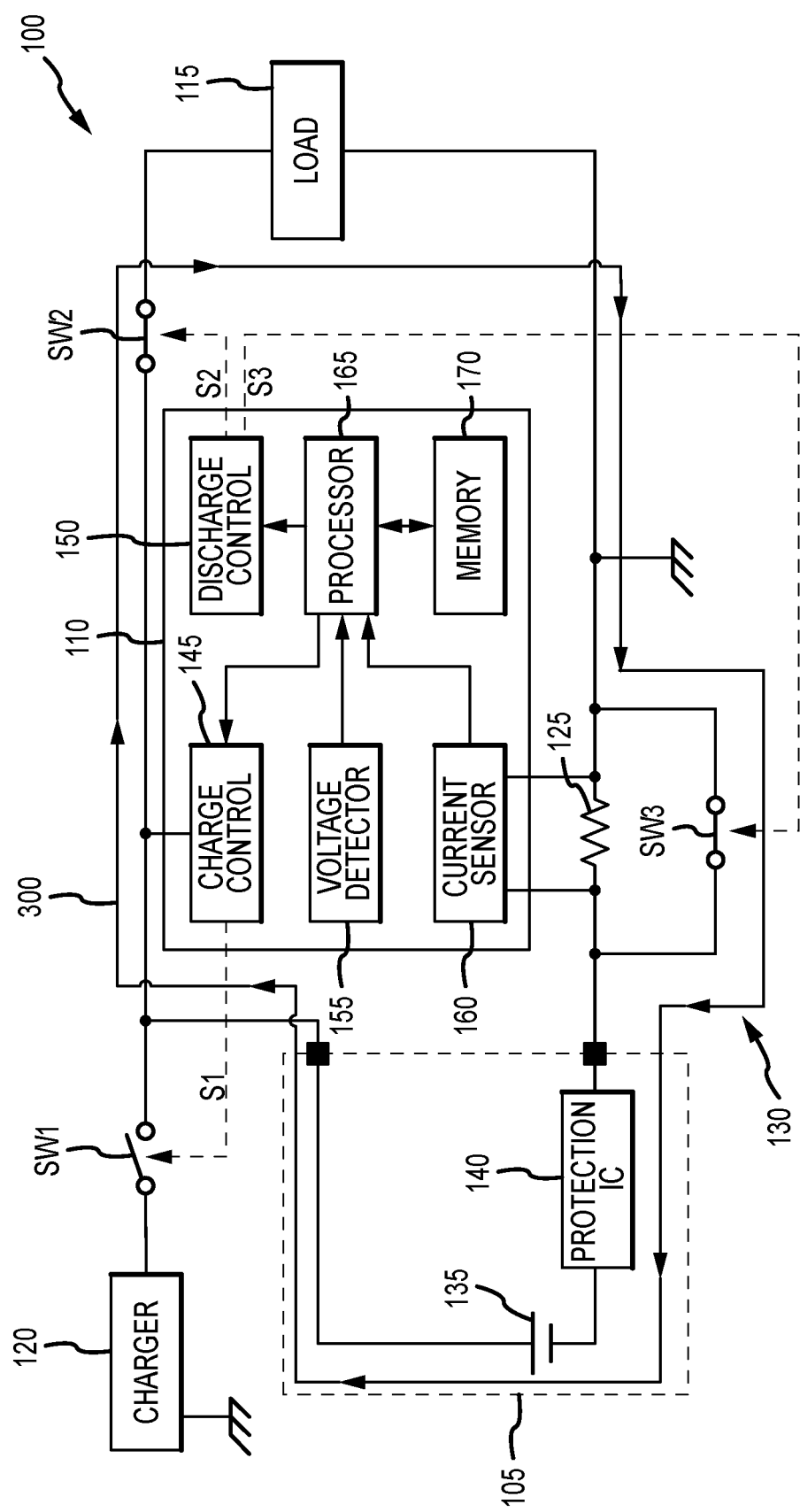
FIG. 3 is a block diagram of the battery system in a discharging mode and in accordance with an exemplary embodiment of the present technology.

Methods and system for a battery according to various aspects of the present technology may be integrated in any suitable electronic system and/or device, such as "smart devices," wearables, battery-powered consumer electronics, portable devices, battery-powered vehicles, and the like. Referring to FIGS. 1-3, an exemplary system 100 may be integrated in an electronic device (not shown), such as a vaping device or an electric vehicle, powered by a rechargeable battery 135, such as a lithium ion battery. For example, in various embodiments, the system 100 may comprise a charger, a fuel gauge circuit 110, and a bypass circuit 130 that operate in conjunction with the battery 135 to provide power to a load 115, such as a heating coil in the vaping device or a motor in the electric vehicle.

According to an exemplary embodiment, the system 100 may comprise a battery pack 105 comprising the battery 135 and a protection IC 140. The protection IC 140 may be configured to maintain safe battery operating conditions. For example, the protection IC 140 may monitor current flow through the battery 135 and prevent or reduce current flow if the current exceeds a predetermined value.

According to an exemplary embodiment, the system 100 may comprise a first switch SW1 to selectively connect the charger 120 to the battery 135. According to an exemplary embodiment, the fuel gauge circuit 110 may generate a first control signal S1 to operate the first switch SW1. The first switch SW1, in conjunction with the first control signal S1, may control a charge current 200 from the charger 120 to the battery 135.

The system 100 may further comprise a second switch SW2 to selectively connect the battery 135 to the load 115. According to an exemplary embodiment, the fuel gauge circuit 110 may generate a second control signal S2 to operate the second switch SW2. The second switch SW2, in conjunction with the second control signal S2, may control a discharge current 300 from the battery 135 to the load 115.

According to an exemplary embodiment, the system 100 may further comprise a sense resistor 125. The sense resistor 125 may be used to measure a current of the system 100 and may be connected to the fuel gauge circuit 110. In addition, the sense resistor 125 may be connected between the battery 135 and the load 115. In one embodiment, the protection IC 140 may be connected between the battery 135 and the sense resistor 125.

The fuel gauge circuit 110 may be configured to manage various battery operations and monitor various battery conditions. For example, the fuel gauge circuit 110 may be configured to measure a voltage V (e.g., an open circuit voltage $V_{OC}$ during a no-load condition or a voltage $V_T$ during charging or discharging) of the battery 135, determine a discharge current, compute a remaining capacity (also expressed as a percentage and referred to as the state of charge (SOC) or remaining state of charge (RSOC)) of the battery 135, compute a state of health (SOH) of the battery 135, estimate a lifespan of the battery 135, determine an energy capability of the battery 135, and the like.

In addition, the fuel gauge circuit 110 may be configured to store various battery data. For example, the fuel gauge circuit 110 may store predetermined battery characteristics, such as open circuit voltage values of the battery 135 as a function of the remaining capacity of the battery 135. The fuel gauge circuit 110 may also store known battery characteristics and/or profile data of the battery 135.

In an exemplary embodiment, the fuel gauge circuit 110 may control charging and discharging operations of the battery 135 via the bypass circuit 130. The bypass circuit 130 may be connected in parallel with the sense resistor 125 and may comprise any circuit suitable for enabling and disabling a current path. In an exemplary embodiment, the bypass circuit 130 may comprise a third switch SW3 (e.g., a transistor or other device suitable for enabling/disabling current flow) that is responsive to a third control signal S3, and the third switch SW3 may be connected in parallel with the sense resistor 125.

In an exemplary embodiment, the fuel gauge circuit 110 may comprise a voltage detector 155 to measure or otherwise detect the voltage V of the battery 101. The voltage detector 155 may be connected to the battery 135 and may comprise any circuit and/or device suitable for measuring a voltage potential.

In an exemplary embodiment, the fuel gauge circuit 110 may further comprise a current sensor 160 to measure the current to/from the battery 135. The current sensor 160 may comprise any circuit and/or device suitable for measuring the charging current of the battery 135. During charging, the current sensor 160 may operate in conjunction with a sense resistor 125, wherein the current senor 160 measures the voltage across the sense resistor 125 to determine a magnitude (value) of the charging current.

Figure 4:
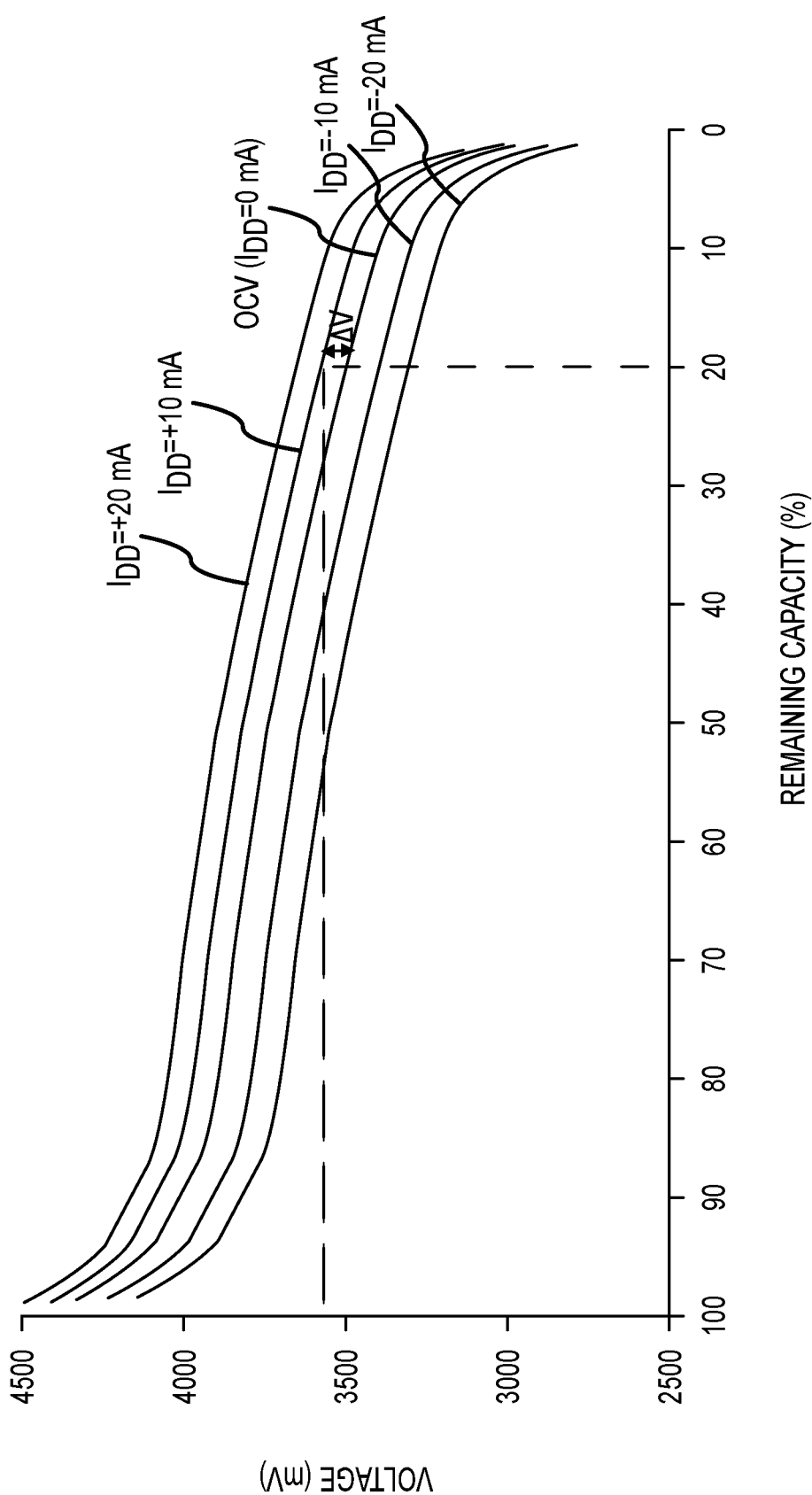
FIG. 4 is a graph circuit model of a battery in accordance with an exemplary embodiment of the present technology.

In an exemplary embodiment, the fuel gauge circuit 110 may further comprise a memory 170 to store the known battery characteristic data and/or profile data of the battery 135. The battery characteristic data may describe a relationship among voltage, remaining capacity, and current. The battery characteristic data may provide open circuit voltage (OCV) values as a function of the remaining capacity of the battery 135 (e.g., the OCV curve in FIG. 4). The open circuit voltage characteristics may be predetermined by testing the battery 135 under open circuit (i.e., no load) conditions and may be stored in a look-up table or any other data storage suitable for storing relational data. The battery characteristic data may further comprise current data as a function of voltage and remaining capacity (e.g., as illustrated in FIG. 4). The current data as a function of voltage and remaining capacity may be stored in a look-up table or other data storage device.

The memory 170 may also store various previously- and currently-computed or measured variables, such as the battery voltage, current, and the like.

The memory 170 may comprise any number of storage devices, such as registers, a flash memory device, EEPROM (electrically erasable programmable read-only memory), ROM (read only memory), and RAM (random access memory), and the like.

In an exemplary embodiment, the fuel gauge circuit 110 may comprise the processor 165, wherein the processor 165 may perform various computations and analysis that may be used to operate the system 100. According to an exemplary embodiment, the processor 165 may receive voltage data from the voltage detector 155 and current data from the current sensor 160. The processor 135 may be further configured to access various data from the memory 170, such as the battery characteristic data.

In various embodiments, the processor may comprise a remaining capacity calculation circuit (not shown) configured to determine the remaining capacity (referred to as a relative state of charge or state of charge) of the battery 135. In an exemplary embodiment, the remaining capacity calculation circuit may be configured to determine the remaining capacity according to the open circuit voltage $V_{OC}$ of the battery 135 during a no-load condition (the battery 135 is neither charging nor discharging). In general, utilizing the open circuit voltage $V_{OC}$ of the battery 135 to determine the remaining capacity is referred to as "the voltage method."

According to an exemplary embodiment, the remaining capacity calculation circuit may be connected to the voltage detector 155 and receive the measured open circuit voltage $V_{OC}$. The remaining capacity calculation circuit may utilize the open circuit voltage data (i.e., data from the OCV curve of FIG. 4) to determine the remaining capacity based on the measured open circuit voltage $V_{OC}$ and transmit the remaining capacity data to the processor 165. For example, a measured open circuit voltage $V_{OC}$ of 4000 mV corresponds to 90% remaining capacity on the OCV curve.

Alternatively, the processor 165 may determine the remaining capacity based on a measured voltage $V_T$ of the battery 135 during discharging by computing a current based on an internal resistance R of the battery 135 and changes in the measured voltage $\Delta V_T$ (i.e., $I=\Delta V_T/R$). The processor 165 may determine an accumulated current by performing the current calculation a number of times over a specified period of time. The accumulated current may then be used to determine the remaining capacity of the battery 135—this method for determining the remaining capacity based on current is generally referred to as "coulomb counting."

In various embodiments, the processor 165 may use various battery measurements and other external control signals to control charging and discharging of the battery 135. For example, the processor 165 may communicate with a charge control circuit 145 and a discharge control circuit 150.

According to various embodiments, the processor 165 may comprise any number of circuits, systems, logic gates, and/or software to perform the desired computations and/or selections, as described above. For example, the processor 165 may comprise a field programmable gate array, an application specific integrated circuit, programs and operating information, and the like.

The fuel gauge circuit 110 may further comprise the charge control circuit 145 configured to control charging of the battery 135. For example, the charge control circuit 145 may be configured to generate the first control signal S1 and control a duty cycle of the first control signal S1, which controls the first switch SW1, and thus controls the flow of the charge current 200 from the charger 120 to the battery 135. The first control signal S1 may be a pulse-width modulated signal. In an exemplary embodiment, the charge control circuit 145 may receive operation signals (such as a timing signals or control signals) from the processor 165 and generate the first control signal S1 accordingly.

The charge control circuit 145 may comprise any circuit and/or system suitable for generating a pulse-width modulated signal, such as a PMW controller (not shown), a timer (not shown), a waveform generator, flip flops, and the like.

The fuel gauge circuit 110 may further comprise the discharge control circuit 150 configured to control discharging of the battery 135. For example, the discharge control circuit 150 may be configured to generate the second control signal S2 and control a duty cycle of the second control signal S2, which controls the second switch SW2, and thus controls the flow of the discharge current 300 from the battery 135 to the load 115. The second control signal S2 may be a pulse-width modulated signal. In an exemplary embodiment, the discharge control circuit 150 may receive operation signals (such as a timing signals or control signals) from the processor 165 and generate the second control signal S2 accordingly.

In an exemplary embodiment, the discharge control circuit 150 may be further configured to generate the third control signal S3, which controls the bypass circuit 130, such as the third switch SW3, and thus controls the flow of the discharge current 300 from the battery 135 to the load 115. The third control signal S3 may be synchronized with the second control signal S2. In other words, both the second and third switches SW2, SW3 are open and closed at the same time. In an exemplary embodiment, the discharge control circuit 150 may generate the third control signal S2 according to the operation signals from the processor 165.

The discharge control circuit 150 may comprise any circuit and/or system suitable for generating a pulse-width modulated signal and/or other non-pulse-width modulated signals, such as a PMW controller (not shown), a timer (not shown), a waveform generator, flip flops, and the like.

In an exemplary operation, and referring to FIGS. 1-4, the system 100 may provide a current path used for charging the battery 135 and an alternative current path (e.g., a discharge current loop) used for discharging the battery 135.

In an exemplary embodiment, during a charge mode (charging of the battery 135), the charge current 200 may flow from the charger 120 to the battery 135, through the sense resistor 125 to ground. The system 100 may achieve the charge current path by closing the first switch SW1 and opening the second and third switches SW2, SW3. For example, the processor 165 may transmit operation signals to the charge control circuit 145 and the discharge control circuit 150 indicating that the system 100 is in charge mode. In turn, the charge control circuit 145 may generate the first control signal S1 to close the first switch SW1, and discharge control circuit 150 may generate the second and third control signals S2, S3 to open the second and third switches SW2, SW3. During the charge mode, the fuel gauge circuit 110 may detect the magnitude (value) of the current using the current sensor 160 and the sense resistor 125, as described above.

In an exemplary embodiment, during a discharge mode (discharging of the battery 135) the discharge current 300 flows in a current loop from the battery 135 to the load 115, from the load 115 through the bypass circuit 130 and back to the battery 135. The system 100 may achieve the discharge current loop by opening the first switch SW1 and closing the second and third switches SW2, SW3. Since the resistance of the sense resistor 125 is greater than the resistance of the bypass circuit 130, the discharge current 300 will be directed through the bypass circuit 130, thereby avoiding the sense resistor 125. For example, the processor 165 may transmit operation signals to the charge control circuit 145 and the discharge control circuit 150 indicating that the system 100 is in discharge mode. In turn, the charge control circuit 145 may generate the first control signal S1 to open the first switch SW1, and discharge control circuit 150 may generate the second and third control signals S2, S3 to close the second and third switches SW2, SW3.

During the discharge mode, the fuel gauge circuit 110 may detect the magnitude (value) of the discharge current comprising determining the remaining capacity of the battery 135, such as according to the "voltage method" or "coulomb counting" described above. The fuel gauge circuit 110 may use a measured voltage $V_T$, such as from the voltage detector 155, and determine a change in voltage from an open circuit voltage on the OCV curve (i.e., $\Delta V = V_T - V_{OC}$). The fuel gauge circuit 110 may use the change in voltage, the remaining capacity, and the battery characteristic data to extract the magnitude of the discharge current. For example, if the fuel gauge circuit 110 determines that the remaining capacity is 20% and measures a voltage of 3600 mV, then the change in voltage from the open circuit voltage is 100 mV. In the example graph, a remaining capacity of 20% with +100 mV change from the open circuit voltage corresponds to a current of +10 mA. If the relational data is stored in a look-up table (e.g., in the memory 170), the fuel gauge circuit 110 may extract the magnitude of the current from the table based on the change in voltage and the remaining capacity. It should be noted that the values in FIG. 4 are for illustrative purposes only and that the values of remaining capacity, voltage, and current may vary based on the particular battery characteristics, desired system specifications, and the like.

Alternatively, the fuel gauge circuit 110 may directly compute the magnitude of the discharge current I based on the change in voltage ($\Delta V$ as described above) and a known internal resistance R of the battery 135 using Ohm's law (i.e., $I = \Delta V/R$). The known internal resistance R may be stored in the memory 170.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodi-

The invention claimed is:

1. An apparatus capable of connecting to a battery, comprising:
    a sense resistor configured to connect to the battery at a first terminal and a reference voltage at a second terminal;
    a fuel gauge circuit configured to connect to the battery and comprising a current sensor, wherein the current sensor is connected to the first and second terminals and measures a voltage across the sense resistor;
    wherein the fuel gauge circuit further comprises a memory, wherein the memory comprises battery characteristic data describing a relationship among voltage, current, and remaining capacity;
    a bypass circuit connected in parallel with the sense resistor and responsive to a first control signal from the fuel gauge circuit;
    a processor in communication with the memory and the processor determines a magnitude of a discharge current of the battery based on a remaining capacity of the battery, a measured battery voltage, and the battery characteristic data.

2. The apparatus according to claim 1, wherein the fuel gauge circuit further comprises a voltage detector to measure a voltage of the battery.

3. The apparatus according to claim 1, wherein the bypass circuit passes the discharge current.

4. The apparatus according to claim 1, wherein the bypass circuit comprises a first switch that operates according to the first control signal.

5. The apparatus according to claim 1, further comprising a second switch connected between the battery and a load, wherein the second switch is responsive to a second control signal from the fuel gauge circuit.

6. A method for determining a magnitude of a discharge current from a battery to a load, comprising:
    generating the discharge current, wherein the discharge current flows from the battery to the load, from the load to a bypass circuit, through the bypass circuit and to the battery; wherein the bypass circuit is connected in parallel with a sense resistor;
    determining a change in voltage from an open circuit voltage during the discharge current; and
    determining the magnitude of the discharge current based on the change in voltage.

7. The method according to claim 6, wherein generating the discharge current comprises:
    activating a first switch connected between the battery and the load; and
    activating a second switch connected in parallel with the sense resistor.

8. The method according to claim 6, wherein determining the magnitude of the discharge current is further based on a remaining capacity of the battery and battery characteristic data, wherein the battery characteristic data comprises a look-up table describing a relationship among voltage, current, and remaining capacity.

9. The method according to claim 6, wherein determining the magnitude of the discharge current comprises extracting the magnitude from a look-up table based on a remaining capacity of the battery and the change in voltage.

10. The method according to claim 6, wherein determining the magnitude of the discharge current comprises directly computing the magnitude based on the change in voltage and a resistance of the battery.

11. A system, comprising:
    a battery configured to deliver power to a load via a discharge current loop;
    a sense resistor connected to the battery;
    a bypass circuit connected in parallel with the sense resistor and responsive to a first control signal from a fuel gauge circuit; and
    the fuel gauge circuit connected to the battery and configured to determine a magnitude of a discharge current comprising:
        flowing the discharge current through the discharge current loop, wherein the discharge current loop comprises the battery, the load, and the bypass circuit; and
        during flow of the discharge current:
            determining a change in voltage of the battery from an open circuit voltage; and
            determining the magnitude of the discharge current based on the change in voltage.

12. The system according to claim 11, wherein the fuel gauge circuit comprises a voltage detector to measure a voltage of the battery.

13. The system according to claim 12, wherein the fuel gauge circuit further comprises a processor in communication with the voltage detector, wherein the processor computes a remaining capacity of the battery according to the open circuit voltage of the battery.

14. The system according to claim 11, wherein the fuel gauge circuit further comprises a memory, wherein the memory comprises battery characteristic data describing a relationship among voltage, current, and remaining capacity.

15. The system according to claim 14, further comprising a processor in communication with the memory and determines the magnitude of the discharge current based on a remaining capacity of the battery, the change in voltage, and the battery characteristic data.

16. The system according to claim 11, wherein the bypass circuit comprises a first switch that operates according to the first control signal.

17. The system according to claim 11, further comprising a second switch connected between the battery and the load, wherein the second switch is responsive to a second control signal from the fuel gauge circuit.

* * * * *